(12) United States Patent
Dickey

(10) Patent No.: US 8,618,887 B2
(45) Date of Patent: Dec. 31, 2013

(54) CONFIGURABLE SPREAD SPECTRUM OSCILLATOR

(75) Inventor: John A. Dickey, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 13/248,098

(22) Filed: Sep. 29, 2011

(65) Prior Publication Data

US 2013/0082786 A1   Apr. 4, 2013

(51) Int. Cl.
*H03B 29/00* (2006.01)
*H03K 3/26* (2006.01)

(52) U.S. Cl.
USPC ............ 331/47; 331/78; 331/50; 331/111; 331/143

(58) Field of Classification Search
USPC ............ 331/46, 47, 50, 111, 143, 57, 78
See application file for complete search history.

(56) References Cited

U.S. PATENT DOCUMENTS

| | | | |
|---|---|---|---|
| 4,183,278 A * | 1/1980 | Rea et al. ............ | 84/694 |
| 4,255,722 A | 3/1981 | Hochstrate | |
| 4,558,305 A * | 12/1985 | Black et al. ............ | 340/384.72 |
| 4,626,799 A * | 12/1986 | Matievic ............ | 331/47 |
| 6,611,549 B1 | 8/2003 | Nagata | |
| 6,851,929 B2 | 2/2005 | Goldberg | |
| 7,161,970 B2 | 1/2007 | Lim et al. | |
| 7,423,494 B1 | 9/2008 | Xin-LeBlanc | |
| 7,869,176 B2 | 1/2011 | Davison | |
| 2006/0007987 A1 | 1/2006 | Yoneda | |
| 2007/0008018 A1 | 1/2007 | Nagashima et al. | |
| 2008/0100350 A1 | 5/2008 | Pernia et al. | |
| 2008/0157894 A1 | 7/2008 | Hariton et al. | |
| 2009/0021208 A1 | 1/2009 | Romenesko et al. | |
| 2010/0007390 A1 | 1/2010 | Yeh | |
| 2011/0131449 A1 | 6/2011 | Hess et al. | |
| 2011/0169582 A1 | 7/2011 | Kim et al. | |

FOREIGN PATENT DOCUMENTS

JP   2003101408 A   4/2003

OTHER PUBLICATIONS

European Search Report dated Feb. 1, 2013 for Application No. 12186567.9.

* cited by examiner

*Primary Examiner* — Ryan Johnson
(74) *Attorney, Agent, or Firm* — Cantor Colburn LLP

(57) ABSTRACT

A spread spectrum oscillator includes a high frequency oscillator circuit configured to oscillate at a first frequency, and a low frequency oscillator circuit configured to oscillate at a second frequency and resistively coupled to a current summing node of the high frequency oscillator circuit. The first frequency is higher than the second frequency.

12 Claims, 3 Drawing Sheets

CONFIGURABLE SPREAD SPECTRUM OSCILLATOR

BACKGROUND OF THE INVENTION

Generally, the present invention is directed to oscillators, and more particularly, exemplary embodiments of the present invention are directed to configurable spread spectrum oscillators.

Oscillators may be used in power supplies to achieve a plurality of functionality, for example, sinusoidal or time-varying output. Spread spectrum oscillators produce a frequency sweep of time-varying outputs which may be very useful in reducing electromagnetic interference in power supplies as well as for providing additional functionality.

BRIEF DESCRIPTION OF THE INVENTION

According to an exemplary embodiment of the present invention, a spread spectrum oscillator includes a high frequency oscillator circuit configured to oscillate at a first frequency, and a low frequency oscillator circuit configured to oscillate at a second frequency and resistively coupled to a current summing node of the high frequency oscillator circuit. The first frequency is higher than the second frequency.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Conventionally, spread spectrum oscillators include complex components that are difficult to implement in a variety of applications. However, one or more of the embodiments of the present invention disclosed herein may provide a spread spectrum oscillator which is both low in cost and highly configurable. The technical effects and benefits of the present invention include greater adaptability and easier integration in power supplies.

Figure 1:
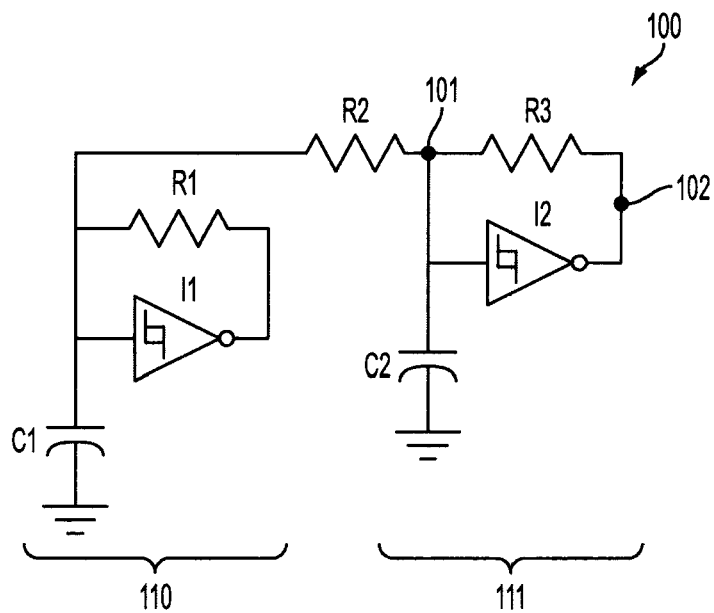
FIG. 1 is a diagram of a spread spectrum oscillator, according to an exemplary embodiment.

Turning to FIG. 1, a basic spread spectrum oscillator 100 is illustrated. The oscillator 100 includes a first resistor R1, a first inverter I1, and a first capacitor C1 arranged as a low frequency oscillator circuit 110. The first inverter I1 may be a non-linear trigger inverter, such as a Schmitt trigger Inverter, to promote a non-sinusoidal triangle-like waveform at a low frequency. Furthermore, the first capacitor C1 may actively couple the input of the first inverter I1 to ground. The actual values of the resistor R1 and capacitor C1 may be chosen to promote low frequency oscillation of the circuit 110 as will be understood by one of ordinary skill the art.

The oscillator 100 further includes a second resistor R3, a second inverter I2, and a second capacitor C2 arranged as a high frequency oscillator circuit 111. The second inverter I2 may be a non-linear trigger inverter, such as a Schmitt trigger Inverter, to promote a non-sinusoidal triangle-like waveform. In one embodiment, the frequency of the non-sinusoidal triangle-like waveform produced by the second inverter I2 is at a frequency higher than that produced by the low frequency oscillator circuit 110. Furthermore, the second capacitor C2 may actively couple the input of the second inverter I2 to ground. The actual values of the resistor R3 and capacitor C2 may be chosen to promote high frequency oscillation of the circuit 111.

The high frequency oscillator circuit 111 may be configured to oscillate at a first frequency and the low frequency oscillator circuit 110 may be configured to oscillate at a second frequency which is lower than the first frequency.

The oscillator further includes a third resistor R2 coupled between respective current summing nodes of the circuits 110 and 111. As such, the actual value of resistor R2 varies an amount of current seen at node 101 of the circuit 111. Furthermore, as the circuit 110 is arranged to produce a non-sinusoidal triangle-like waveform at a relatively low frequency, when the value of the waveform increases and decreases, the frequency of oscillation at circuit 111 increases and decreases or "sweeps." Thus, the particular arrangement illustrated in FIG. 1 forms a spread spectrum oscillator outputting a time-varying and frequency-varying waveform at node 102.

It should be understood that the particular arrangement of the high frequency oscillator circuit 111 and low frequency oscillator circuit 110 may be altered without departing from the spirit and scope of exemplary embodiments of the present invention. For example, the associated frequencies of circuits 110 and 111 may be reversed or "flipped" while still providing for spread spectrum oscillation at node 102 (e.g., such that oscillator circuit 111 oscillates at a lower frequency than oscillator circuit 110).

Furthermore, the frequency of oscillation, rate of change in frequency, and size of the frequency spectrum swept may be configurable through selection of any desired values for ratios between the resistors and capacitors illustrated. For example, resistor R1 and capacitor C1 control the frequency of the circuit 110 and thus also the rate of change in frequency of the output node 102, resistor R3 and capacitor C2 control the base oscillation frequency of circuit 111, and resistor R2 controls the size of the spectrum swept at node 102. However, many more aspects of a spread spectrum oscillator may be controlled and configured through the addition of relatively simple electronic components.

Figure 2:
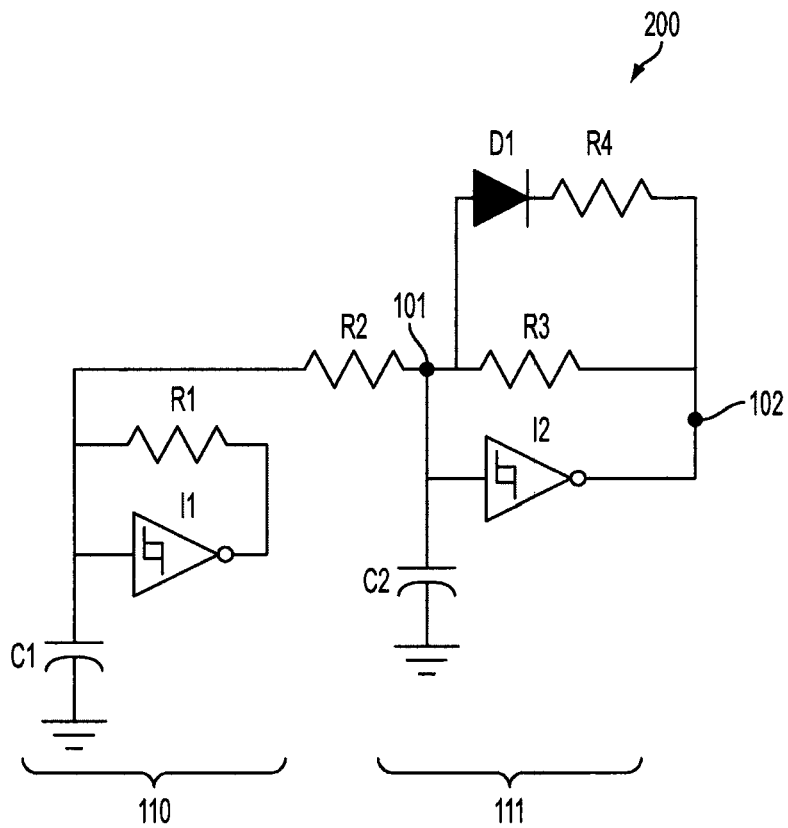
FIG. 2 is a diagram of a spread spectrum oscillator with fixed duty cycle adjustability, according to an exemplary embodiment.

For example, FIG. 2 is a diagram of a spread spectrum oscillator with fixed duty cycle adjustability, according to an exemplary embodiment. The oscillator 200 is substantially similar to the oscillator 100, with the addition of the diode D1 and the resistor R4. As illustrated, the diode D1 and resistor R4 are electrically in series with one another and connected between the current summing node 101 and the output node 102. As such, the diode D1 in combination with resistor R4 alters the duty cycle of the waveform at the node 102 because of the switching nature of the diode D1, which serves to change an amount of current flowing during charge and discharge cycles of the capacitors illustrated, thereby adjusting the duty cycle seen at output node 102. The varying degree of duty cycle change is caused by selection of the size of resistor R4 and breakdown voltage of the diode D1. Furthermore, a direction of the p-n junction of the diode D1 determines which half of the duty cycle is adjusted, and may therefore be changed from one direction to another to adjust duty cycle. Thus, the oscillator 200 includes a fixed duty cycle adjustability.

Figure 3:
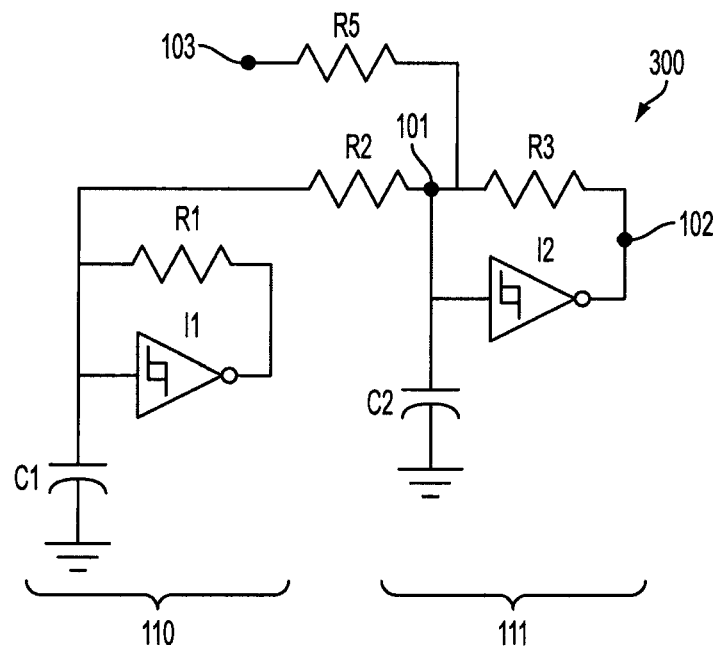
FIG. 3 is a diagram of a spread spectrum oscillator with adjustable duty cycle adjustability, according to an exemplary embodiment.

However, the same may also be continually adjustable. For example, FIG. 3 is a diagram of a spread spectrum oscillator with continually adjustable duty cycle adjustability, according to an exemplary embodiment. The oscillator 300 is substantially similar to the oscillator 100, with the addition of the resistor R5 and duty cycle adjust node 103. As arranged, a positive voltage applied at node 103 increases an overall duty cycle of a waveform seen at node 102. Alternatively, a negative voltage at node 103 decreases an overall duty cycle of a waveform seen at node 102. As such, different control voltages may be applied at node 103 for continual adjustment. For example, feedback from a line voltage of a power supply in communication with the oscillator 300 may be applied for adjusting and trimming a duty cycle at node 103.

Figure 4:
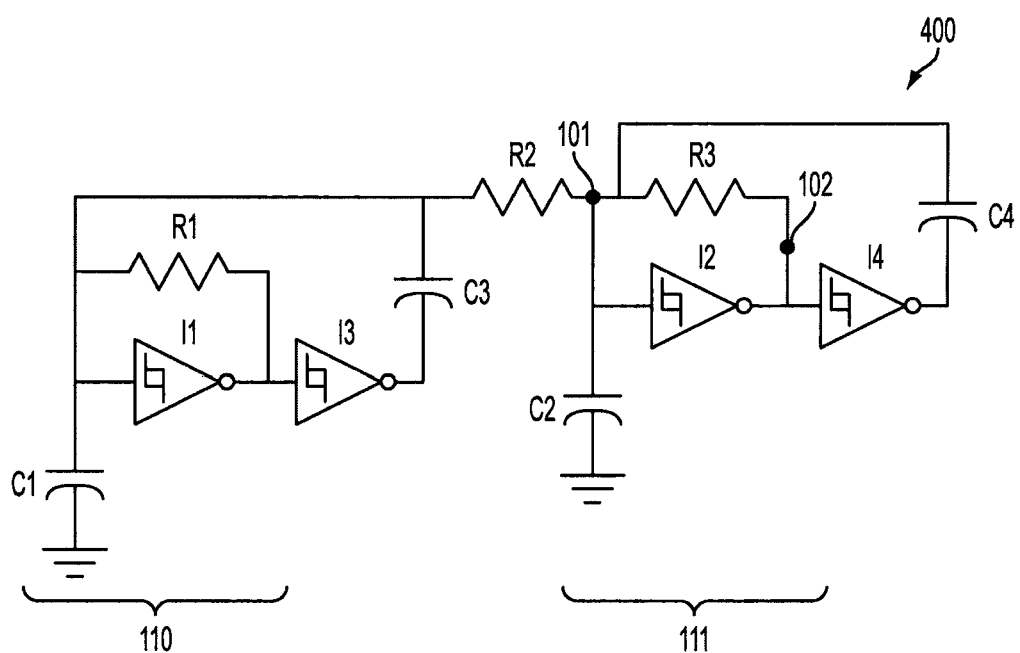
FIG. 4 is a diagram of a spread spectrum oscillator with stabilized hysteresis, according to an exemplary embodiment.

In addition to duty cycle and frequency adjustments, it should be appreciated that other adjustments may be desirable. For example, FIG. 4 is a diagram of a spread spectrum oscillator with stabilized hysteresis, according to an exemplary embodiment. According to a real-world implementation of exemplary embodiments of the present invention, there may be a range of actual hysteresis provided by real, pre-packaged inverters due to manufacturing and packaging inconsistencies. However, as illustrated in FIG. 4, the oscillator 400 includes stabilized hysteresis through the addition of additional inverters I3 and I4 and capacitors C3 and C4 arranged in series across respective output and summing nodes of the circuits 110 and 111. Therefore, the arrangement of oscillator 400 allows for capacitive voltage division which reduces part-to-part hysteresis differences across the inverters I1 and I3. Additionally, the arrangement of oscillator 400 allows for capacitive for capacitive voltage division which reduces part-to-part hysteresis differences across the inverters I2 and I4. As such, through capacitive voltage division the hysteresis differences across a plurality of parts is stabilized thereby realizing consistency across different implementations of spread spectrum oscillators as described herein. It is noted that although particularly illustrated as Schmitt trigger inverters, any other form of inverter may used for inverters I3 and I4 depending upon any desired implementation while still allowing for stabilized hysteresis.

Figure 5:
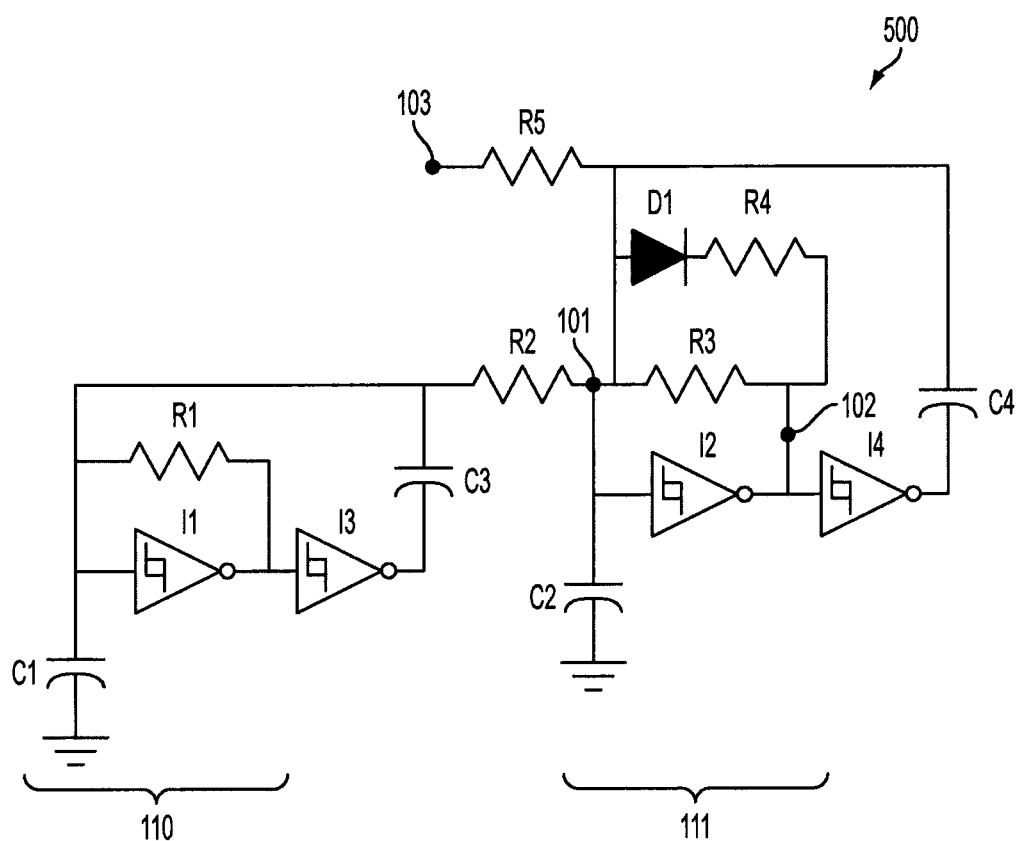
FIG. 5 is a diagram of a spread spectrum oscillator including a plurality of configuration options, according to an exemplary embodiment.

As described above with reference to FIGS. 1-4, a plurality of different configurations each comprising simple electronic components may be made to the basic spread spectrum oscillator 100 to achieve a plurality of different configurations. Furthermore, one or more of these alternate configurations may be implemented concurrently. For example, FIG. 5 is a diagram of a spread spectrum oscillator including all of the plurality of configuration options described above, according to an exemplary embodiment.

As illustrated, the oscillator 500 comprises the high frequency oscillator circuit 111 configured to oscillate at a first frequency and the low frequency oscillator circuit 110 configured to oscillate at a second, lower frequency. The low frequency oscillator circuit 110 is resistively coupled to the current summing node of high frequency oscillator circuit 111 through resistor R2. Furthermore, the oscillator 500 includes a fixed duty cycle adjust network achieved through diode D1 and resistor R4. Moreover, the oscillator 500 includes a continually adjustable duty cycle about the fixed adjust value through feedback received at node 103. Finally, part-to-part hysteresis has also been stabilized with positive feedback through the use of capacitive voltage division through the combination of inverter I3 and capacitor C3, and through the combination of inverter I4 and capacitor C4.

Although illustrated as discrete combinations of particular components, it should be readily understood by one of ordinary skill in the art that many alternatives are also suitable, according to any desired implementation. For example, more or less components may be arranged such that the basic functionality of the spread spectrum oscillator as described herein is maintained while allowing for on-the-fly configuration changes through voltage line feedback, switches for re-arranging discrete components, modification through adjustable devices (e.g., varactors and/or varistors), and/or any other suitable modification.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A spread spectrum oscillator, comprising:
a first frequency oscillator circuit configured to oscillate at a first frequency, the first frequency oscillator including:
a first resistance;
a first Schmitt trigger inverter in parallel communication with the first resistance; and
a first capacitor actively coupling the first resistance and first Schmitt trigger inverter to ground;
a second frequency oscillator circuit configured to oscillate at a second frequency and resistively coupled to a current summing node of the first frequency oscillator circuit, wherein the first frequency is higher than the second frequency; and
a capacitive voltage division network arranged in communication with the high frequency oscillator circuit, wherein the capacitive voltage division network is configured to stabilize hysteresis in the first Schmitt trigger inverter.

2. The spread spectrum oscillator of claim 1, wherein the capacitive voltage division network comprises:
a first inverter in communication with the first Schmitt trigger inverter; and
a second capacitor actively coupling the first inverter to a current summing node of the high frequency oscillator.

3. The spread spectrum oscillator of claim 1, further comprising a fixed duty cycle adjust network in communication with the high frequency oscillator circuit configured to fixedly adjust a duty cycle of an output of the spread spectrum oscillator.

4. The spread spectrum oscillator of claim 3, wherein the fixed duty cycle adjust network comprises:
a diode in series communication with a current summing node of the first frequency oscillator circuit; and
a resistor coupling the diode to the output of the spread spectrum oscillator.

5. The spread spectrum oscillator of claim 1, further comprising a continually adjustable duty cycle node configured to allow an increase or decrease in a duty cycle of an output waveform in response to an increase or decrease in voltage seen at the continually adjustable duty cycle node.

6. A spread spectrum oscillator, comprising:
a first frequency oscillator circuit configured to oscillate at a first frequency, the first frequency oscillator including:
a first resistance;
a first Schmitt trigger inverter in parallel communication with the first resistance; and
a first capacitor actively coupling the first resistance and first Schmitt trigger inverter to ground;
a second frequency oscillator circuit configured to oscillate at a second frequency and resistively coupled to a current summing node of the first frequency oscillator circuit, wherein the first frequency is higher than the second frequency, wherein the low frequency oscillator circuit comprises:
a second resistance;
a second Schmitt trigger inverter in parallel communication with the second resistance; and
a second capacitor actively coupling the second resistance and second Schmitt trigger inverter to ground; and
a capacitive voltage division network arranged in communication with the second frequency oscillator circuit, wherein the capacitive voltage division network is configured to stabilize hysteresis in the second Schmitt trigger inverter.

7. The spread spectrum oscillator of claim 6, wherein the capacitive voltage division network comprises:
a first inverter in communication with the second Schmitt trigger inverter; and
a third capacitor actively coupling the first inverter to a current summing node of the low frequency oscillator.

8. A spread spectrum oscillator, comprising:
a first frequency oscillator circuit configured to oscillate at a first frequency;
a second frequency oscillator circuit configured to oscillate at a second frequency and resistively coupled to a current summing node of the first frequency oscillator circuit, wherein the first frequency is higher than the second frequency;
wherein the first frequency oscillator circuit comprises: a first resistance, a first Schmitt trigger inverter in parallel communication with the first resistance, and a first capacitor actively coupling the first resistance and first Schmitt trigger inverter to ground;
wherein the second frequency oscillator circuit comprises: a second resistance, a second Schmitt trigger inverter in parallel communication with the second resistance, and a second capacitor actively coupling the second resistance and second Schmitt trigger inverter to ground; and
a first capacitive voltage division network arranged in communication with the first frequency oscillator circuit, wherein the first capacitive voltage division network is configured to stabilize hysteresis in the first Schmitt trigger inverter; and
a second capacitive voltage division network arranged in communication with the second frequency oscillator circuit, wherein the second capacitive voltage division network is configured to stabilize hysteresis in the second Schmitt trigger inverter.

9. The spread spectrum oscillator of claim 8, wherein each capacitive voltage division network comprises:
an inverter and a capacitor actively coupling the inverter to a current summing node of an associated oscillator circuit.

10. The spread spectrum oscillator of claim 8, further comprising a fixed duty cycle adjust network in communication with the high frequency oscillator configured to fixedly adjust a duty cycle of an output of the spread spectrum oscillator.

11. The spread spectrum oscillator of claim 10, wherein the fixed duty cycle adjust network comprises:
a diode in series communication with a current summing node of the high frequency oscillator circuit; and
a resistor coupling the diode to an output of the spread spectrum oscillator.

12. The spread spectrum oscillator of claim 10, further comprising a continually adjustable duty cycle node configured to allow an increase or decrease in a duty cycle of an output waveform in response to an increase or decrease in voltage seen at the continually adjustable duty cycle node.

* * * * *